(12) United States Patent
Eisner et al.

(10) Patent No.: US 8,378,313 B2
(45) Date of Patent: Feb. 19, 2013

(54) UNIFORMITY OF A SCANNED ION BEAM

(75) Inventors: Edward C. Eisner, Lexington, MA (US); Andy Ray, Newburyport, MA (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 18 days.

(21) Appl. No.: 13/077,112

(22) Filed: Mar. 31, 2011

(65) Prior Publication Data

US 2012/0248326 A1 Oct. 4, 2012

(51) Int. Cl.
*H01J 3/26* (2006.01)
*H01J 37/147* (2006.01)

(52) U.S. Cl. ............... 250/398; 250/369 R; 250/492.21; 250/492.3

(58) Field of Classification Search .. 250/492.2–492.22, 250/492.3, 396 R, 398
See application file for complete search history.

(56) References Cited

U.S. PATENT DOCUMENTS

| | | | |
|---|---|---|---|
| 4,283,631 A | 8/1981 | Turner | |
| 4,736,107 A | 4/1988 | Myron | |
| 5,099,130 A * | 3/1992 | Aitken | 250/396 R |
| 6,908,836 B2 | 6/2005 | Murrell et al. | |
| 7,176,470 B1 | 2/2007 | Evans et al. | |
| 7,498,590 B2 | 3/2009 | Dzengeleski | |
| 2004/0232350 A1* | 11/2004 | Iwasawa et al. | 250/396 R |
| 2005/0189500 A1 | 9/2005 | Graf et al. | |
| 2005/0253089 A1 | 11/2005 | Maeno et al. | |
| 2005/0269527 A1 | 12/2005 | Murrell et al. | |
| 2006/0017017 A1* | 1/2006 | Itokawa et al. | 250/492.21 |
| 2008/0067436 A1* | 3/2008 | Vanderberg et al. | 250/492.21 |
| 2008/0073575 A1* | 3/2008 | Dzengeleski | 250/492.21 |
| 2008/0078955 A1* | 4/2008 | Graf et al. | 250/492.21 |
| 2011/0086500 A1 | 4/2011 | Yoneda et al. | |

OTHER PUBLICATIONS

Final Office Action issued Mar. 22, 2012 in connection with the U.S. Appl. No. 12/826,050.
U.S. Appl. No. 12/077,329, filed Mar. 31, 2011.
Office Action issued on Dec. 5, 2011 in connection with U.S. Appl. No. 12/826,050.
U.S. Appl. No. 12/826,050, filed Jun. 29, 2010.
Non-Final Office Action Dated Aug. 13, 2012 for U.S. Appl. No. 13/077,329. 30 Pages.
Notice of allowance dated Dec. 26, 2012 for U.S. Appl. No. 13/077,329.

* cited by examiner

*Primary Examiner* — Robert Kim
*Assistant Examiner* — David E Smith
(74) *Attorney, Agent, or Firm* — Eschweiler & Associates, LLC

(57) ABSTRACT

One embodiment relates to an ion implanter. The ion implanter includes an ion source to generate an ion beam, as well as a scanner to scan the ion beam across a surface of a workpiece along a first axis. The ion implanter also includes a deflection filter downstream of the scanner to ditheredly scan the ion beam across the surface of the workpiece along a second axis.

21 Claims, 5 Drawing Sheets

UNIFORMITY OF A SCANNED ION BEAM

BACKGROUND

In ion implantation systems, an ion beam is directed towards a work piece (e.g., a semiconductor wafer, or a display panel) to implant ions into a lattice thereof. Once embedded into the lattice of the workpiece, the implanted ions change the physical and/or chemical properties of the implanted workpiece region. Because of this, ion implantation can be used in semiconductor device fabrication, in metal finishing, and for various applications in materials science research.

An ion beam often has a cross-sectional area that is significantly smaller than the surface area of a workpiece to be implanted. Because of this, typical ion beams are scanned over the surface of the workpiece until a desired doping profile is achieved in the workpiece. For example, FIG. 1A shows a cross-sectional view of a conventional ion implantation system 100 where an ion beam 102 traces over a scan path 104 to implant ions into the lattice of a workpiece 106. While scanning the ion beam over the scan path 104, the ion implanter makes use of a first axis 108 and a second axis 110 that collectively facilitate two-dimensional scanning over the workpiece surface. In this system 100 there are sufficient scans per unit time over the first axis 108 (e.g., fast axis) to ensure that small features (e.g., small feature 150 in FIG. 1B) on the second axis 110 (e.g., slow axis) are adequately scanned over the entire workpiece. However, when the fast scan speed is slowed to approach the slow scan speed, it is difficult to ensure dose uniformity when very sharp features are present in the beam profile (e.g., small feature 150).

Therefore, aspects of the present disclosure relates to techniques for improving beam uniformity using a scanned ion beam.

SUMMARY

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

One embodiment relates to an ion implanter. The ion implanter includes an ion source to generate an ion beam, as well as a scanner to scan the ion beam across a surface of a workpiece along a first axis. The ion implanter also includes a deflection filter downstream of the scanner to reduce energy contamination and dither the ion beam across the surface of the workpiece along a second axis.

The following description and annexed drawings set forth in detail certain illustrative aspects and implementations of the invention. These are indicative of but a few of the various ways in which the principles of the invention may be employed.

DETAILED DESCRIPTION

Figure 1A:
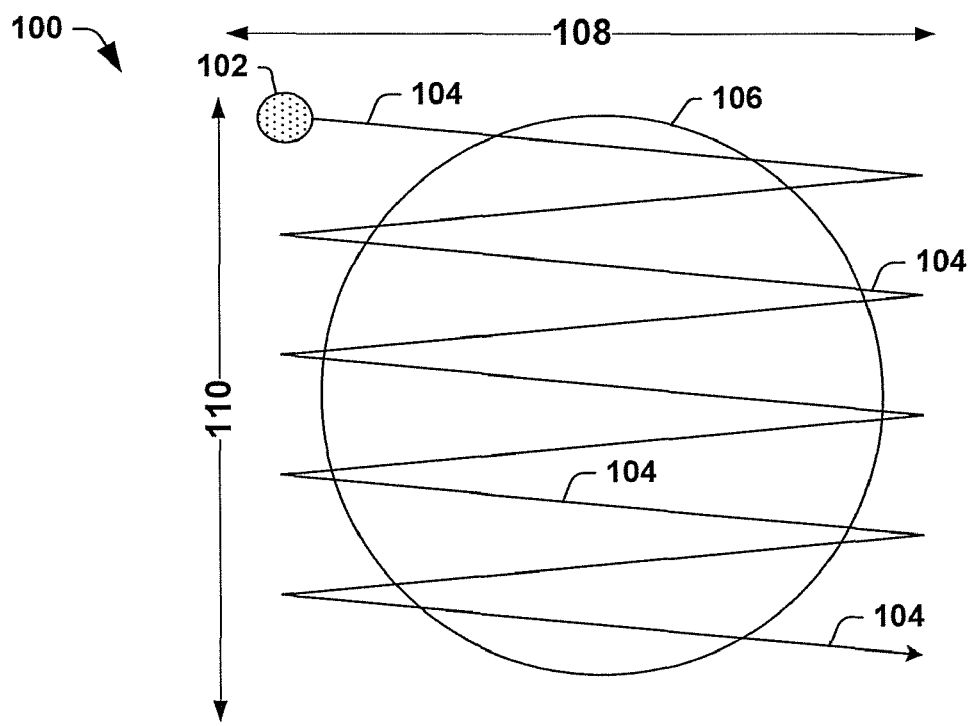
FIG. 1A illustrates a conventional ion scanning technique.

The present invention will now be described with reference to the drawings wherein like reference numerals are used to refer to like elements throughout, and wherein the illustrated structures are not necessarily drawn to scale.

Figure 1B:
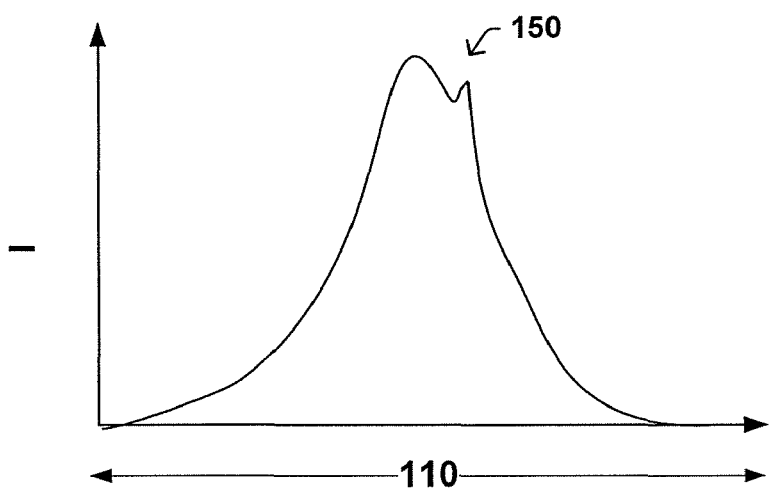
FIG. 1B illustrates a doping profile delivered by a conventional ion scanning technique.
Figure 2:
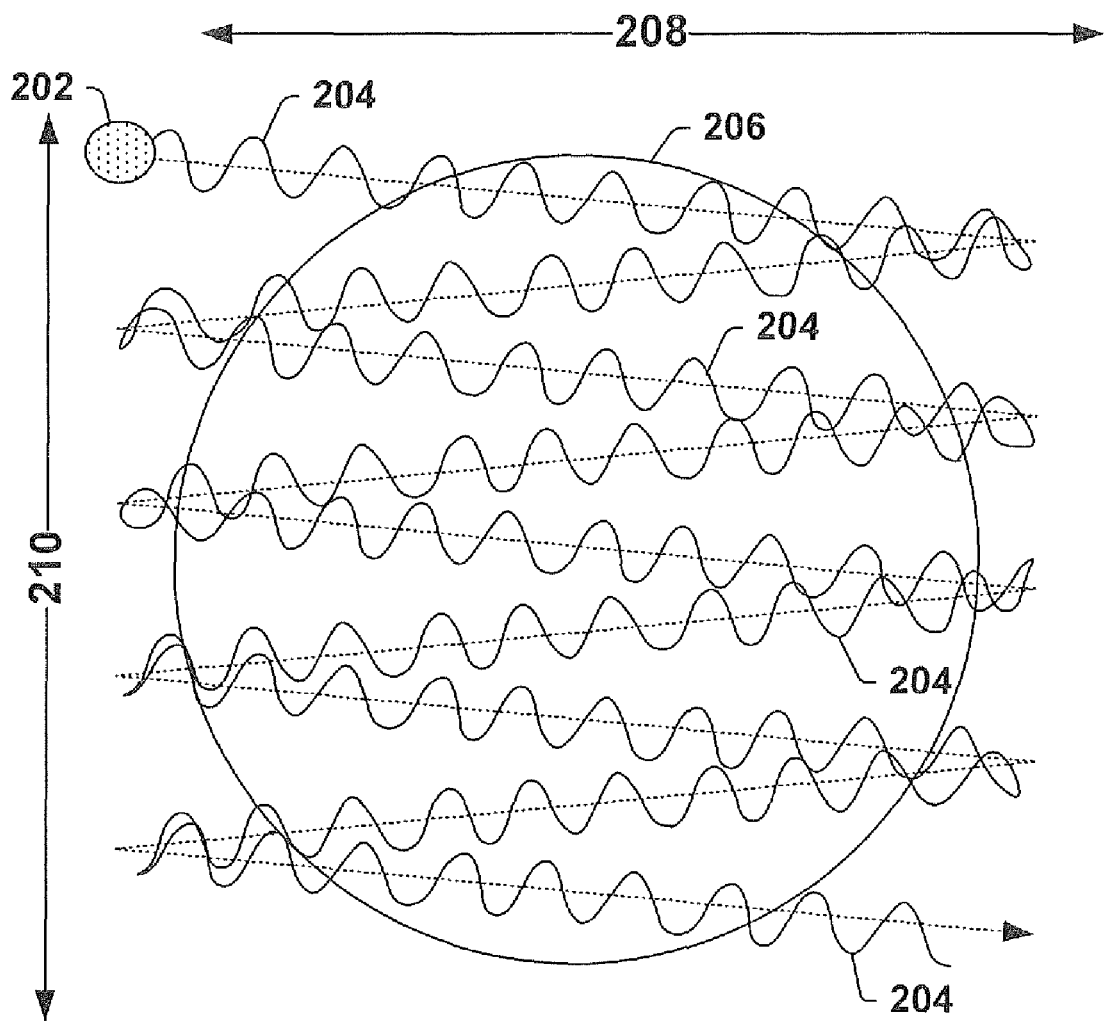
FIG. 2 illustrates an ion scanning technique in accordance with some embodiments.

FIG. 2 shows a scanning technique utilizing an improved scan path in accordance with some aspects of the disclosure. As shown, to trace a scan path 204 over a workpiece surface 206 and thereby implant ions into a workpiece, an ion beam 202 is scanned back and forth over a first axis 208 while being simultaneously and ditheredly scanned over a second axis 210. Thus, rather than scanning the ion beam 202 over the second axis 210 at a fixed unidirectional speed (as was done in the conventional scan technique shown in FIG. 1A), the ion beam 202 is scanned over the second axis with a superposition of a constant speed and a small amplitude, rapid oscillation. Most typically, the scanning of the beam along the first axis 208 is done with an electric or magnetic scanner, while the workpiece is mechanically translated along the second axis 210. However, it is also possible to have the workpiece translated along both axes 208, 210, while the fast oscillation (dither) of the beam is achieved with an electric or magnetic beam scanner. Thus "dither" in this context can refer to the manner in which predetermined, random, or pseudo-random perturbations are used to prevent large-scale patterns such as "banding" or "striping" in the doping profile, which can be objectionable. Sharp features (e.g. sharp feature 150 in FIG. 1B) can cause striping and dithering effectively blurs these features, making them less sharp, and thus less detrimental to the uniformity of the implanted doping profile.

Figure 3:
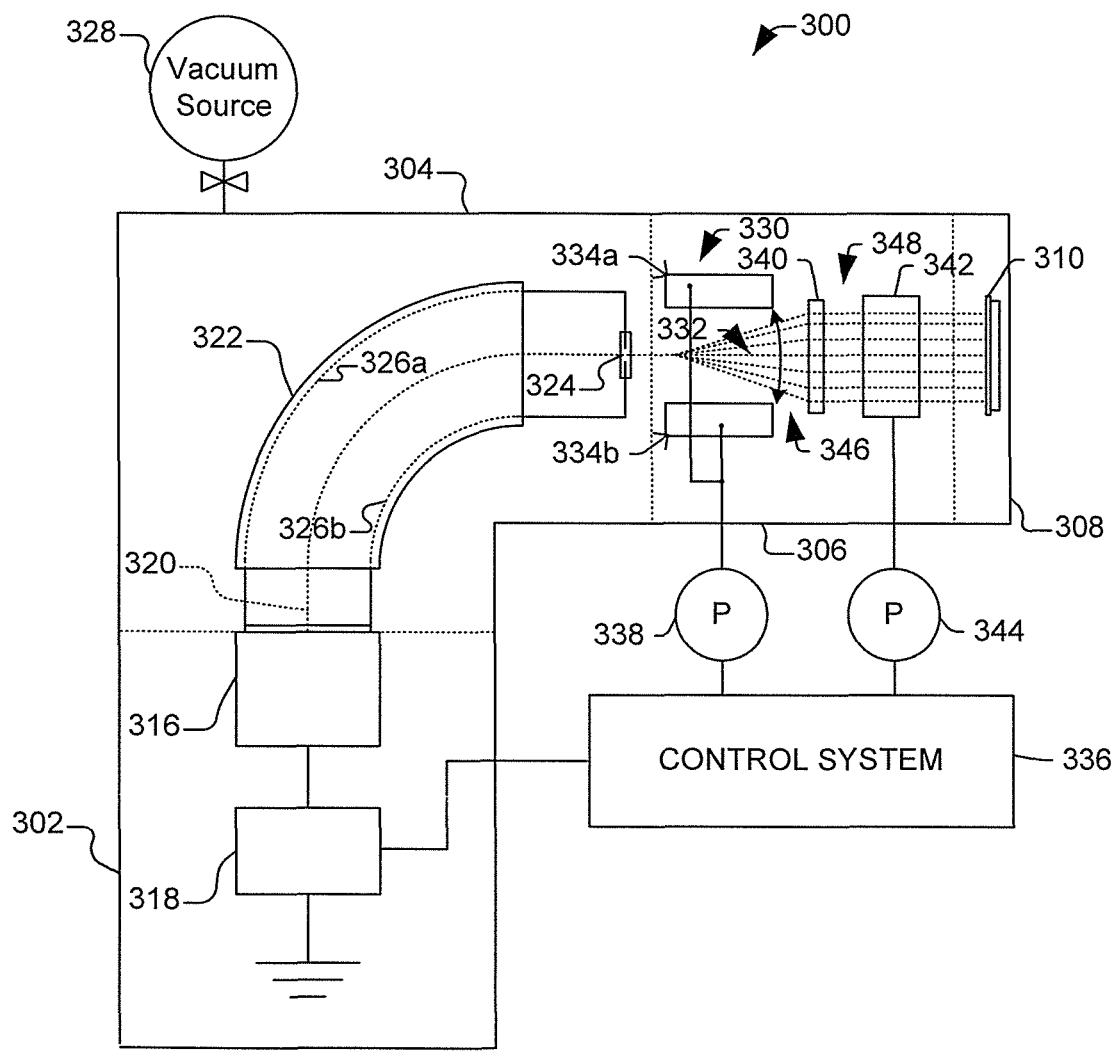
FIG. 3 illustrates an ion implantation system in accordance with some embodiments.

FIG. 3 illustrates one embodiment of an ion implantation system 300 operable to carry out scanning techniques in accordance with some aspects of the invention. The ion implantation system 300 includes a source terminal 302, a beamline assembly 304, a scan system 306, and an end station 308, which are collectively arranged so as to inject ions (dopants) into the lattice of a workpiece 310 according to a desired dosing profile.

More particularly, during operation, an ion source 316 in the source terminal 302 is coupled to a high voltage power supply 318 to ionize dopant molecules (e.g., dopant gas molecules), thereby forming a pencil ion beam 320.

To steer the pencil beam 320 from the source terminal 302 towards the workpiece 310, the beamline assembly 304 has a mass analyzer 322 in which a dipole magnetic field is established to pass only ions of appropriate charge-to-mass ratio through a resolving aperture 324. Ions having an inappropriate charge-to-mass ratio collide with the sidewalls 326a, 326b; thereby leaving only the ions having the appropriate charge-to-mass ratio to pass though the resolving aperture 324 and into the workpiece 310. The beam line assembly 304 may also include various beam forming and shaping structures extending between the ion source 316 and the end station 308, which maintain the pencil beam 320 in an elongated interior cavity or passageway through which the pencil beam 320 is transported to the workpiece 310. A vacuum pumping system 328 typically keeps the ion beam transport passageway at vacuum to reduce the probability of ions being deflected from the beam path through collisions with air molecules.

Upon receiving the pencil beam 320, a scanner 330 within the scan system 306 laterally diverts or "scans" the pencil beam back and forth in time (e.g., in a horizontal direction) to provide the scanned ion beam 332. In some contexts, this type of scanned pencil beam may be referred to as a ribbon beam. In the illustrated embodiment, the scanner 330 is an electrical scanner that includes a pair of electrodes 334a, 334b arranged on opposing sides of the scanned beam 332. A control system 336 induces a change in a variable power source 338 to provide a time-varying current or voltage on the electrodes 334a, 334b, thereby inducing an oscillatory time-varying electric field in the beam path region and scanning the ion beam back and forth in time. In other embodiments, the scanner 330 can be a magnetic scanner that provides a time-varying magnetic field in the beam path region, thereby scanning the ion beam in time. In some embodiments, only a single electrode (rather than a pair of electrodes) can be used.

A parallelizer 340 in the scan system can redirect the scanned ion beam 332 so that the ion beam strikes a surface of the workpiece 310 at the same angle of incidence over the entire surface of the workpiece.

A deflection filter 342, which is controlled by control system 336 and powered by a variable power source 344, diverts the parallelized scanned ion beam along a second axis that can be perpendicular to the first axis. For example, in FIG. 3, the second axis could extend into the plane of the page or out of the plane of the page. The deflection filter 342 can impart a time-independent deflection and a time-dependent "dithered" deflection. Because the deflection filter 342 is downstream of the parallelizer 340 the working gaps of the corrector and deflection filter 342 are limited compared to solutions where a scanner is used to scan the ion beam in two dimensions before the correctors. This helps to reduce cost of the beam line by simplifying the parallelizer 340 and the deflection filter 342. Also, because this solution limits the volume to be pumped down to vacuum, it can also in some instances improve the vacuum, which limits collisions between ions and air molecules and thus helps improve the resolution/accuracy of the beam.

In some embodiments, a quadrupole can be arranged between the scanner 330 and the deflection filter 342, as shown by reference number 346 or 348 in FIG. 3, for example.

Figure 5:
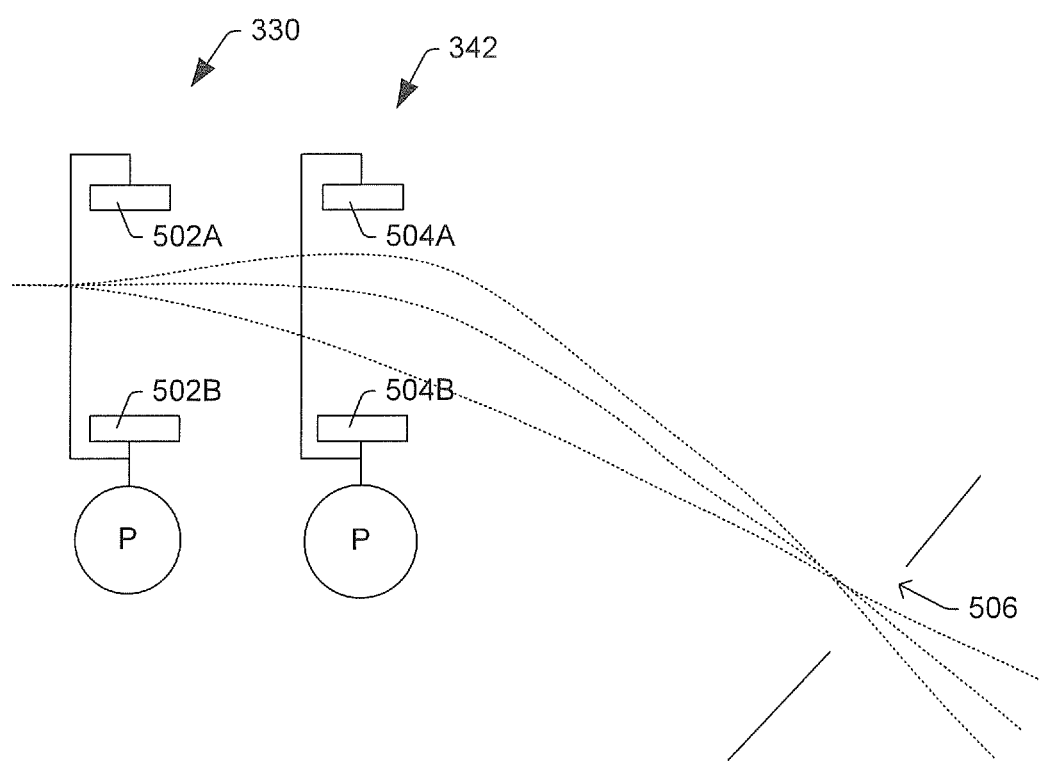
FIG. 5 illustrates a side view of another scanned and dithered ion beam.

FIG. 5 shows another embodiment where scanner electrodes 502A, 502B scan an ion beam back and forth, and deflection filter electrodes 504A, 504B deflect the beam and also introduce dither to the scanned ion beam. Voltages on the electrodes 502A, 502B, 504A, 504B change the beam trajectory so that the scanned beam passes through the center of beam resolving slits 506 downstream of the scanner.

Figure 4A:
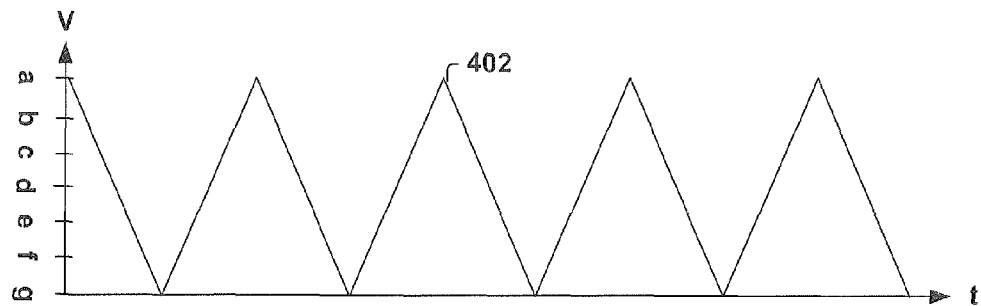
FIGS. 4A-4B illustrate voltage waveforms consistent with the scanning technique of FIG. 4C.
Figure 4B:
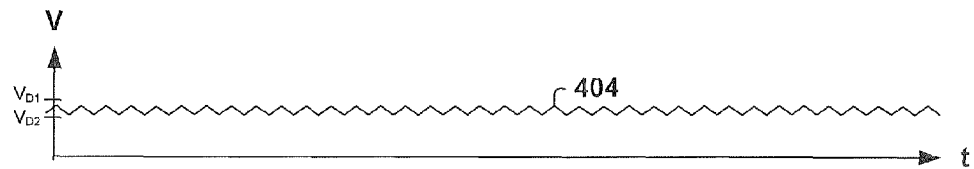
Figure 4C:
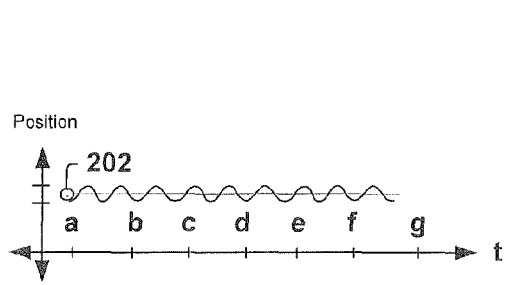
FIG. 4C illustrates an ion scanning technique that makes use of electrical fields in accordance with some embodiments.
Figure 4D:
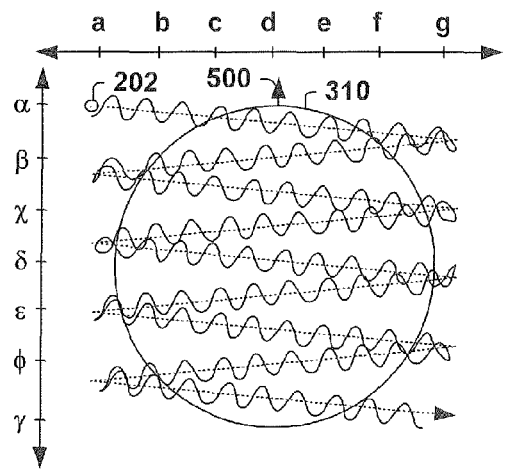
FIG. 4D illustrates how the ion scanning technique of FIG. 4C works in coordinated fashion with workpiece translation to implant ions into a workpiece, in accordance with some embodiments.

FIG. 4A shows an example of a first scan voltage 402 that can be applied to the scanner electrodes (e.g., 334a, 334b in FIG. 3), while FIG. 4B shows a second scan voltage 404 that can be applied to the deflection filter electrodes. In some systems the steady relative motion in the slow scan direction 262 is from mechanically moving the workpiece, while in other systems, these scan voltages can collectively trace the ion beam over the scan path illustrated in FIG. 4C. In some systems, the first scan voltage 402 scans the ion beam 202 back and forth on the first axis in time (e.g., between points A and G in FIG. 4C), while the second scan voltage 404 can introduce dither (e.g., vertical displacement in FIG. 4C). As shown in FIG. 4D, when a workpiece 310 is translated 500 along a second axis (e.g., top edge of workpiece 310 moves from point □ to point □ in FIG. 4D) and the first and second scan voltages are concurrently applied to the beam, the ion beam effectively traces over a 2-dimensional scan path that covers the surface of the workpiece.

Although FIG. 4A-4B depict voltages that establish a time-varying electrical field to scan the beam, it will be appreciated that a time-varying magnetic field could also be used in other embodiments. In some embodiments, the scanner can use a time-varying electric field and the deflection filter can use a time-varying magnetic field, or vice versa.

Although the invention has been illustrated and described with respect to one or more implementations, alterations and/or modifications may be made to the illustrated examples without departing from the spirit and scope of the appended claims. For example, different types of end stations 108 may be employed in the ion implantation system 300. In some embodiments, a "batch" type end station can simultaneously support multiple workpieces on a rotating support structure, wherein the workpieces are rotated through the path of the ion beam until all the workpieces are completely implanted. A "serial" type end station, on the other hand, can be used in other embodiments. Serial type end stations support a single workpiece along the beam path for implantation, wherein multiple workpieces are implanted one at a time in serial fashion, with each workpiece being completely implanted before implantation of the next workpiece begins. Further, although FIG. 3 illustrated a ion implantation system where the beam was electrically or magnetically scanned in a first (X or fast scan) direction while the workpiece is mechanically scanned in a second (Y or slow scan) direction to impart the scanned ion beam over the entire workpiece; other systems could mechanically scan the ion beam along two different axes rather than using electrical or magnetic translation.

In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. The term "exemplary" as used herein is intended to imply an example, as opposed to best or superior. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implanter comprising:
    an ion source to generate an ion beam;
    a scanner to scan the ion beam back and forth over a surface of a workpiece along a first axis, thereby providing a scanned ion beam;
    a parallelizer positioned downstream of the scanner, wherein the parallelizer receives the scanned ion beam at a plurality of different impingent angles in time and alters the different impingent angles of the scanned ion beam to output a parallelized ion beam; and a deflection filter downstream of the parallelizer to introduce dither to the parallelized ion beam along a second axis, wherein the second axis traverses the first axis.

2. The ion implanter of claim 1, wherein the deflection filter is configured to provide a time-independent deflection of the scanned ion beam as well as introducing the dither to the scanned ion beam.

3. The ion implanter of claim 1, wherein the ion beam is scanned along the first axis according to a scan frequency and is dithered along the second axis according to a dither frequency, wherein the dither frequency is greater than the scan frequency.

4. The ion implanter of claim 1, further comprising:
a mechanical assembly to translate the workpiece along the second axis, whereby the scanner, deflection filter, and mechanical assembly operate in coordinated fashion to implant ions into the workpiece.

5. The ion implanter of claim 4, wherein the ion beam is scanned along the first axis so as to intermittently reach a peak scan speed and wherein the workpiece is translated along the second axis at a translational speed that is less than the peak scan speed.

6. The ion implanter of claim 1, further comprising:
a beam passage between the scanner and deflection filter that includes an inner surface defining a cavity through which the scanned ion beam passes, wherein the cavity has a cross-sectional area having a first distance along the first axis and a second distance on the second axis, wherein the second distance is less than the first axis.

7. The ion implanter of claim 1, further comprising:
a quadrupole positioned between the scanner and the deflection filter.

8. The ion implanter of claim 1, wherein the scanner comprises:
a first set of electrodes on which a first time-varying waveform is provided, wherein the first time-varying waveform induces the ion beam to scan across the surface of the workpiece along the first axis.

9. The ion implanter of claim 8, wherein the deflection filter comprises:
a second set of electrodes, wherein a second time-varying waveform is provided on the second set of electrodes to introduce the dither to the scanned ion beam.

10. The ion implanter of claim 1, wherein the scanner comprises:
one or more magnets to provide a first time-varying magnetic field within the scanner, wherein the first time-varying magnetic field induces the ion beam to scan across the surface of the workpiece along the first axis.

11. The ion implanter of claim 1, wherein the deflection filter comprises:
one or more magnets to provide a second time-varying magnetic field downstream of the scanner, wherein the second time-varying magnetic field induces the dither to the scanned ion beam.

12. A method for implanting ions into a workpiece, comprising:
generating an ion beam;
scanning the ion beam back and forth along a first axis at a first scan rate to provide a scanned ion beam;
parallelizing the scanned ion beam to provide a parallelized, scanned ion beam; and
introducing dither to the parallelized, scanned ion beam.

13. The method of claim 12, wherein the ion beam is scanned along the first axis according to a scan frequency and is dithered along a second axis according to a dither frequency, wherein the dither frequency is greater than the scan frequency.

14. The method of claim 12, further comprising:
translating the workpiece along a second axis that traverses the first axis, such that the workpiece is translated in coordinated fashion with the parallelized, scanned ion beam exhibiting dither to implant ions into the workpiece.

15. The method of claim 14, wherein the ion beam is scanned along the first axis so as to intermittently reach a peak scan speed and wherein the workpiece is translated along the second axis at a translation speed that is less than the peak scan speed.

16. The method of claim 14, wherein the first axis is at least substantially perpendicular to the second axis.

17. The method of claim 12, wherein scanning along the first axis is achieved by applying a time-varying electric field to the ion beam.

18. The method of claim 12, wherein scanning along the first axis is achieved by applying a time-varying magnetic field to the ion beam.

19. The method of claim 12, wherein introducing dither is achieved by applying a time-varying magnetic field to the parallelized, scanned ion beam.

20. The method of claim 12, wherein introducing dither is achieved by applying a time-varying electric field to the parallelized, scanned ion beam.

21. An ion implanter comprising:
means for generating an ion beam;
means for scanning the ion beam back and forth along a first axis; and
means for receiving the scanned ion beam at a plurality of different impingent angles in time and altering the different impingent angles of the scanned ion beam to output a parallelized ion beam; and
means for introducing dither to the parallelized ion beam downstream of the means for scanning the ion beam.

* * * * *